(12) United States Patent
Hou et al.

(10) Patent No.: US 9,412,678 B2
(45) Date of Patent: Aug. 9, 2016

(54) STRUCTURE AND METHOD FOR 3D IC PACKAGE

(71) Applicant: Taiwan Semiconductor Manufacturing Company, Ltd., Hsin-Chu (TW)

(72) Inventors: Shang-Yun Hou, Jubei (TW); Der-Chyang Yeh, Hsin-Chu (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/664,057

(22) Filed: Mar. 20, 2015

(65) Prior Publication Data

US 2015/0194361 A1 Jul. 9, 2015

Related U.S. Application Data

(62) Division of application No. 13/791,305, filed on Mar. 8, 2013, now Pat. No. 8,993,380.

(51) Int. Cl.
*H01L 23/31* (2006.01)
*H01L 21/56* (2006.01)
(Continued)

(52) U.S. Cl.
CPC .......... *H01L 23/3157* (2013.01); *H01L 21/561* (2013.01); *H01L 21/563* (2013.01); *H01L 21/565* (2013.01); *H01L 21/568* (2013.01); *H01L 21/6835* (2013.01); *H01L 21/76898* (2013.01); *H01L 23/3114* (2013.01); *H01L 23/3135* (2013.01); *H01L 23/3142* (2013.01); *H01L 23/49816* (2013.01); *H01L 23/49827* (2013.01); *H01L 23/49838* (2013.01); *H01L 23/5389* (2013.01); *H01L 24/11* (2013.01); *H01L 24/81* (2013.01); *H01L 24/96* (2013.01); *H01L 24/97* (2013.01); *H01L 25/0655* (2013.01); *H01L 25/0657* (2013.01); *H01L 25/50* (2013.01); *H01L 24/13* (2013.01); *H01L 25/03* (2013.01); *H01L 2224/0401* (2013.01); *H01L 2224/04105* (2013.01); *H01L 2224/0557* (2013.01); *H01L 2224/05569* (2013.01); *H01L 2224/12105* (2013.01); *H01L 2224/131* (2013.01); *H01L 2224/13022* (2013.01); *H01L 2224/13111* (2013.01); *H01L 2224/13139* (2013.01); *H01L 2224/13147* (2013.01); *H01L 2224/16146* (2013.01); *H01L 2224/1703* (2013.01); *H01L 2224/17181* (2013.01);
(Continued)

(58) Field of Classification Search
USPC .................................................. 257/738, 773
See application file for complete search history.

(56) References Cited

U.S. PATENT DOCUMENTS 6,762,488 B2 7/2004 Maeda et al.
2004/0251531 A1* 12/2004 Yang ..................... H01L 21/563
257/686

(Continued)

FOREIGN PATENT DOCUMENTS

CN 102931102 2/2013
TW I229425 3/2005

*Primary Examiner* — Yasser A Abdelaziez
(74) *Attorney, Agent, or Firm* — Slater Matsil, LLP

(57) ABSTRACT

A chip package may include: a first die; a second die; an underfill disposed between and in physical contact with the first die and the second die; and one or more conductive elements encapsulated in the underfill and coupling the first die and the second die to each other.

20 Claims, 9 Drawing Sheets

(51) Int. Cl.
*H01L 23/538* (2006.01)
*H01L 21/683* (2006.01)
*H01L 23/00* (2006.01)
*H01L 25/065* (2006.01)
*H01L 21/768* (2006.01)
*H01L 25/00* (2006.01)
*H01L 23/498* (2006.01)
*H01L 25/03* (2006.01)

(52) U.S. Cl.
CPC ......... *H01L2224/32225* (2013.01); *H01L 2224/73204* (2013.01); *H01L 2224/73259* (2013.01); *H01L 2224/81005* (2013.01); *H01L 2224/81193* (2013.01); *H01L 2224/81986* (2013.01); *H01L 2224/83104* (2013.01); *H01L 2224/9202* (2013.01); *H01L 2224/96* (2013.01); *H01L 2224/97* (2013.01); *H01L 2225/06513* (2013.01); *H01L 2225/06541* (2013.01); *H01L 2924/12042* (2013.01); *H01L 2924/181* (2013.01)

(56) References Cited

U.S. PATENT DOCUMENTS

2006/0063312 A1 3/2006 Kurita et al.
2013/0040423 A1 2/2013 Tung et al.

* cited by examiner

STRUCTURE AND METHOD FOR 3D IC PACKAGE

PRIORITY CLAIM AND CROSS-REFERENCE

This application is a divisional of U.S. patent application Ser. No. 13/791,305, entitled "Structure and Method for 3D IC Package," filed on Mar. 8, 2013, which application is hereby incorporated herein by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. Interposer stacking is part of 3D IC technology, where a Through-Silicon-Via (TSV) embedded interposer is connected to a device silicon with a micro bump. 3D IC manufacturing process flows can be separated into two types. In a chip-on-chip-on-substrate (CoCoS) process flow, a silicon interposer chip is first attached onto a packaging substrate, and then a different device silicon chips is attached onto the interposer. In a chip-on-wafer-on-substrate (CoWoS) process flow, a device silicon chip is first attached onto a silicon interposer wafer, which is then diced. The resulting stacked silicon is then attached onto a substrate.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
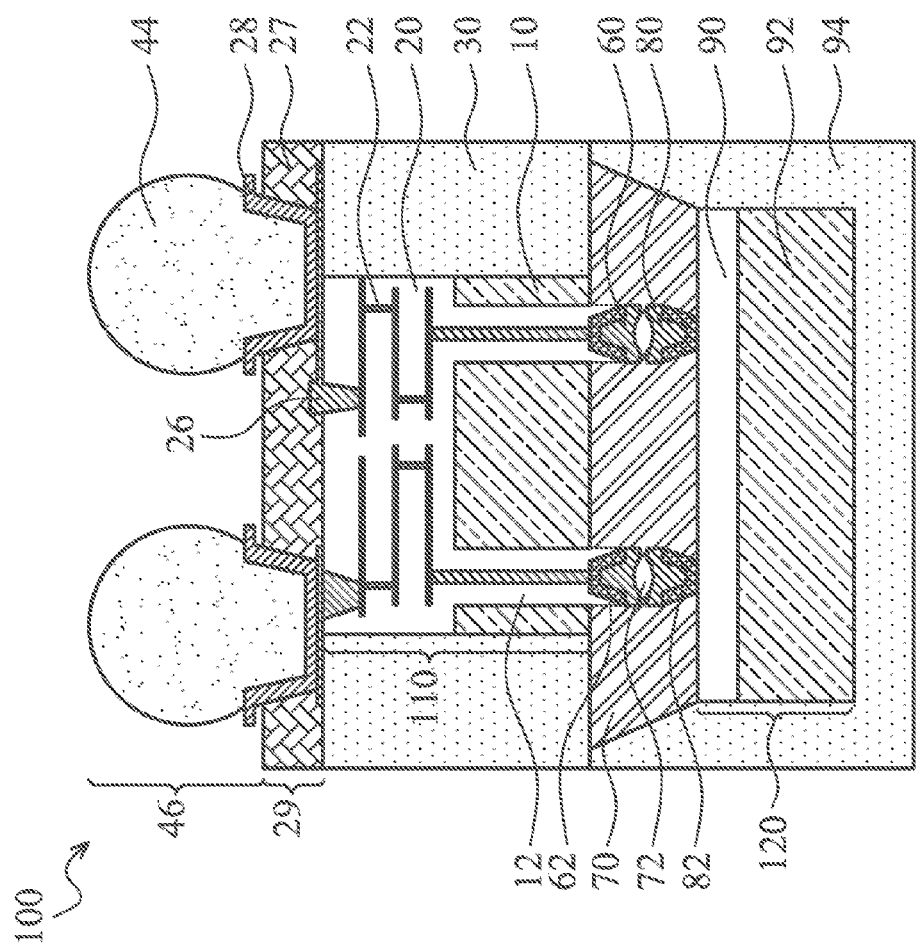
FIG. 1 illustrates a cross section of a chip package according to an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Described herein are embodiments of a chip package structure and a method for forming the chip package. The chip package can be used as a component in 3D IC manufacturing and may be overlaid on a substrate, a board, a wafer, or other chips or chip packages. For example, the chip package may comprise a memory device or component, a processor, other chip logic, or a combination thereof. The chip package may comprise a second chip or die positioned on a first chip or die using a CoWoS like process flow. The process flow provides wafer level packaging that skips using a substrate bonding step as in a typical CoWoS process flow.

The second die may be larger than the first die, and thus may form an overhang structure when placed on the first die during the manufacturing process. To support this overhang structure, the first die may be encapsulated in a first molding compound. After the larger second die is positioned on and electrically coupled to the first die (encapsulated in the first molding compound), an underfill may be injected between the two stacked dies. The second die and the underfill may then be encapsulated in a second molding compound over the first molding compound encapsulating the first die. The second molding compound on the first molding compound and the underfill injected between the second and first dies may provide reliable mechanical support to the overhang structure, which avoids package handling issues during the manufacturing process, such as warping. A interconnect layer or structure comprising a plurality of connectors, such as a ball grid array (BGA), may then be coupled to the first die using a redistribution layer (RDL) or the like, which is placed between the first die and the interconnect layer or structure. The resulting package provides a 3D fan-out structure.

Embodiments are described herein with respect to a specific context, namely a chip package built using a CoWoS like process flow that provides packaging level that skips a substrate bonding step typical of CoWoS process flows. The chip package comprises a system-on-chip (SoC) encapsulated in a first molding compound, and a larger chip placed on an underfill on the SoC die and encapsulated in a second molding compound on the first molding compound. The chip package also includes an interconnect structure with connectors, such as a BGA, coupled to the chip through a RDL. Other embodiments may also be applied, such as for other stacked chips/dies with an overhang structure that is supported using molding compound and underfill layers and fabricated using a similar process flow with packaging level that skips substrate bonding.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

FIG. 1 illustrates a cross section of a chip package 100, according to an embodiment. The chip package 100 may include stacked chips or dies and other interconnect components. The chip package 100 may comprise a die or chip 120 coupled to a second die or chip 110, e.g., a system on chip (SoC), through an underfill 70. The second chip 110 may be encapsulated in a first molding compound 30. The chip 120 may be encapsulated with the underfill 70 in a second molding compound 94 in contact with the first molding compound 30. The second chip 110 (encapsulated in the first molding compound 30) may be coupled on the side opposite to the underfill 70 to a BGA 46 through a RDL 29. In other embodiments, other dies, chips, or chip packages may be included. Other connectors, interconnect structure, or interconnect layer may also be used instead of the BGA 46.

The second chip 110 may comprise a chip system 20 attached to a semiconductor substrate 10. The chip system 20 may comprise one or more stacked chips or chip logic, which may comprise one or more stacked dielectric, conductive, and/or semiconductor layers. For example, the stacked chips or chip logic may correspond to one or more overlaid memory devices (e.g., flash memory and DRAM memory), one or more processors or processor cores (e.g., CPU cores), other digital logic, or combinations thereof. The semiconductor substrate 10 may be a silicon substrate. The chip system 20 may also comprise any number of through vias and pads 22 that extend laterally and vertically in the stacked layers or chips of the chip system 20. The semiconductor substrate 10 may comprise second through vias 12 that are coupled to the through vias and pads 22 in the chip system 20.

The chip 120 may comprise one or more layers 90 (e.g., semiconductor, dielectric, and/or conductive layers) attached to a second semiconductor substrate 92. The one or more layers 90 may comprise a simpler logic than the chip system 20. The first molding compound 30 that encapsulates the second chip 110 and the second molding compound 94 that encapsulates the chip 120 may be similar or different polymers, molding underfill, or the like. In other embodiments, any two dies may be coupled to each other through the underfill 70. For example, a second SoC die may be coupled to the second chip 110 instead of the chip 120. A simple logic chip (e.g., a single layer on substrate) may also be coupled to the chip 120 instead of the second chip 110.

The underfill 70 may be a polymer, such as commercially available epoxy, placed (e.g., injected) between the second chip 110 and the chip 120. The underfill 70 may encapsulate conductive elements 60 (made of metal or any conductor) coupled to the second through vias 12 of the second chip 110, for example through Under-Bump Metallization (UBM) elements 62. The underfill 70 may also encapsulate second conductive elements 80 coupled to the one or more layers 90 of the chip 120, for example through second UBM elements 82. The conductive elements 60 may be aligned and coupled to the second conductive elements 80 through solder balls or bumps 72 or the like, without using an interposer between the chip 120 and the second chip 110. Thus, the conductive elements 60 and the second conductive elements 80 provide electrical coupling between the second chip 110 and the chip 120.

The RDL 29 may comprise a patterned conductive layer 26 coupled to the through vias and pads 22 of the chip system 20, and a polymer layer 27 on the patterned conductive layer 26, the second chip 110, and the first molding compound 30. The BGA 46 may include a plurality of conductive structures 44, such as conductive spheres or microbumps, which may be arranged in an array (or other orderly pattern) and attached to the patterned conductive layer 26 of the RDL 29, e.g., through third UBM elements 28. As such, the patterned conductive layer 26 provide electrical coupling between the BGA 46 and the second chip 110.

Figure 2A:
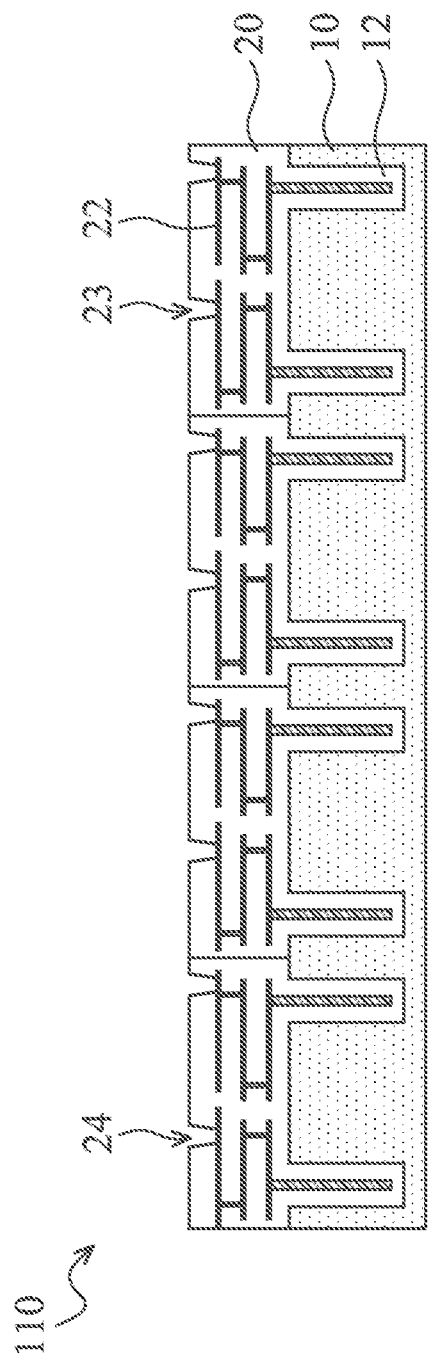
FIGS. 2a through 2h illustrate a process of forming the chip package of FIG. 1 according to an embodiment.

FIGS. 2a through 2h illustrate a process flow to form the chip package 100 according to an embodiment. Although this embodiment is discussed with steps performed in a particular order, steps may be performed in any logical order. FIG. 2a illustrates a step of obtaining of a SoC wafer with through vias comprising an array or series of adjacent and repeated patterns (each corresponding to a second chip 110). The SoC wafer with through vias may be made using any suitable fabrication process, where the second through vias 12 in the semiconductor substrate 10 and the through vias and pads 22 of the chip system 20 may be filled with metal or conductive material. The top surface of the chip system 20 may also include openings 23 that expose the through vias and pads 22.

Figure 2B:
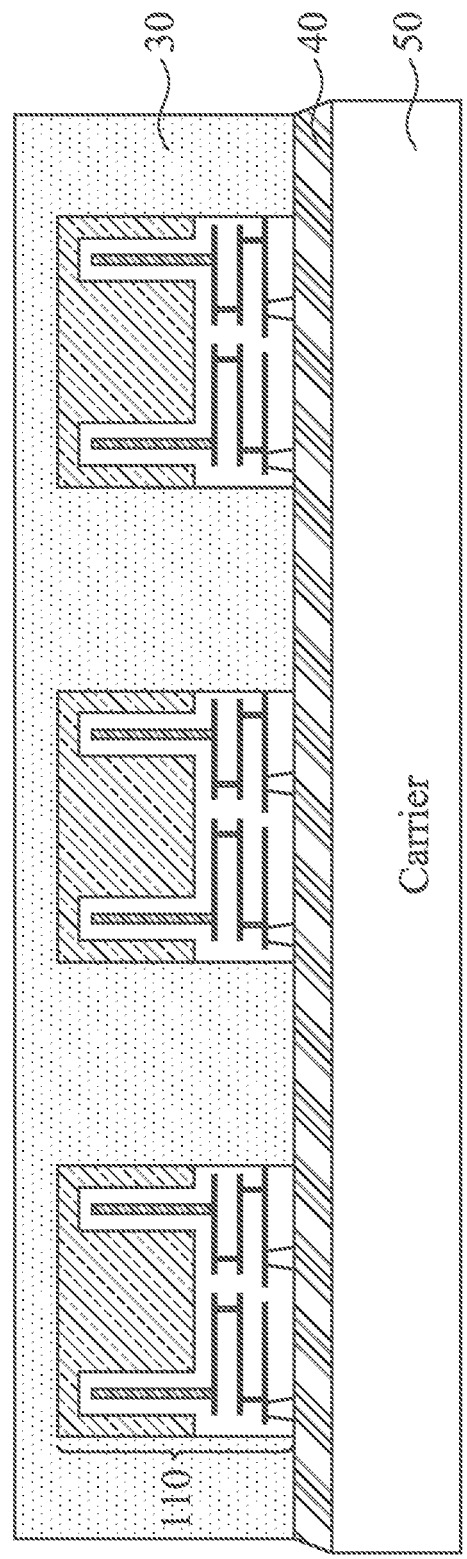

FIG. 2b illustrates reconfiguration and molding steps. The steps include separating the SoC wafer into separate individual dies or second chips 110, e.g., using a chip saw, patterned etch, laser, or the like step. The individual second chips 110 may then be bonded to a carrier 50 through an adhesive layer 40. The adhesive layer 40 may be disposed, for example laminated, on the carriers 50. The second chips 110 may be placed with a spacing between the individual second chips 110 on the carrier 50. The adhesive layer 40 may be formed of a glue or may be a lamination layer formed of a foil. The carrier 50 may be any suitable substrate that provides (during intermediary steps of the fabrication process) mechanical support for the layers on top. The carrier 50 may be, for example, a silicon substrate, a silicon or glass interposer, a printed circuit board (PCB), an organic laminate substrate, or the like. In other embodiments, other types of chip packages or dies may be placed on the adhesive layer 40. The second chips 110 may be formed on the adhesive layer 40 or placed using any suitable method of placing the second chips 110 onto the adhesive layer 40 and integrating the second chips 110 into a manufacturing process flow. The first molding compound 30 may be formed to encapsulate the second chips 110 on the adhesive layer 40. The first molding compound 30 may be a polymer, a molding underfill, the like, or a combination thereof. The first molding compound 30 may be formed by injecting the first molding compound 30 to envelope the second chips 110 on the adhesive layer 40.

Figure 2C:
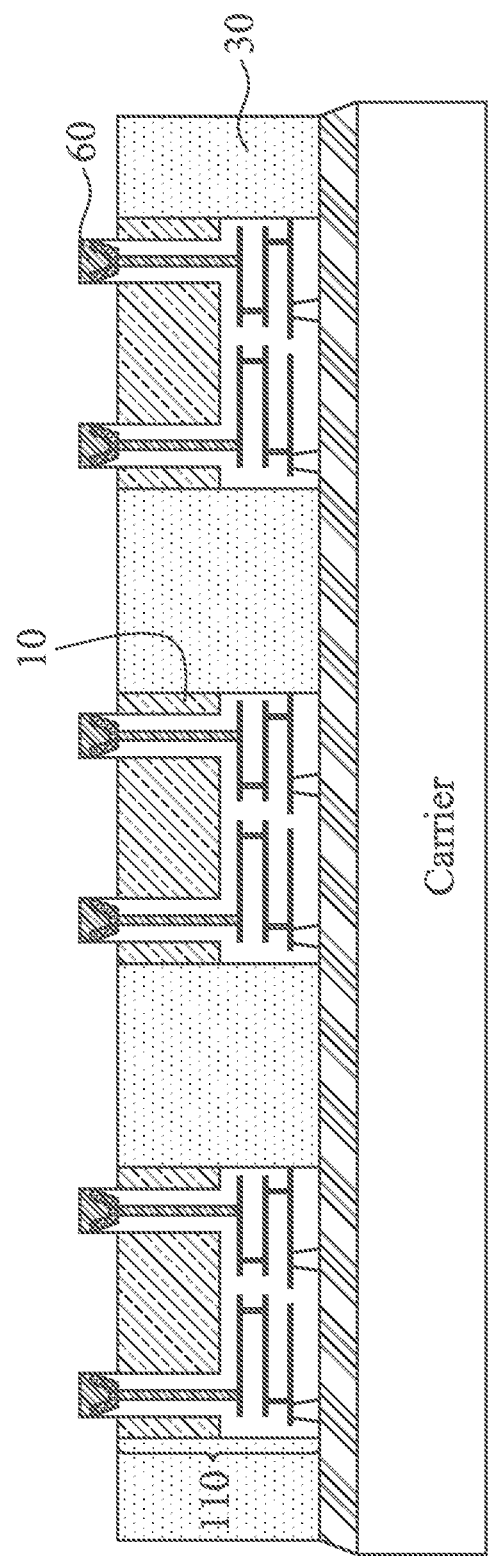

FIG. 2c illustrates steps for adding through vias protrusion and uBumps to the second chips 110. The steps includes grinding the first molding compound 30 to expose the top surface of the second chips 110, and extending the second through vias 12 to the exposed surface of the semiconductor substrate 10, e.g., using etching, patterning processes, laser, or other processes for making through vias. The conductive elements 60 may be placed (e.g., deposited) on the extended second through vias 12 at the surface level of the semiconductor substrates 10 of the second chips 110. The solder balls or bumps 72 or the like may then be placed (e.g., deposited) on the conductive elements 60.

Figure 2D:
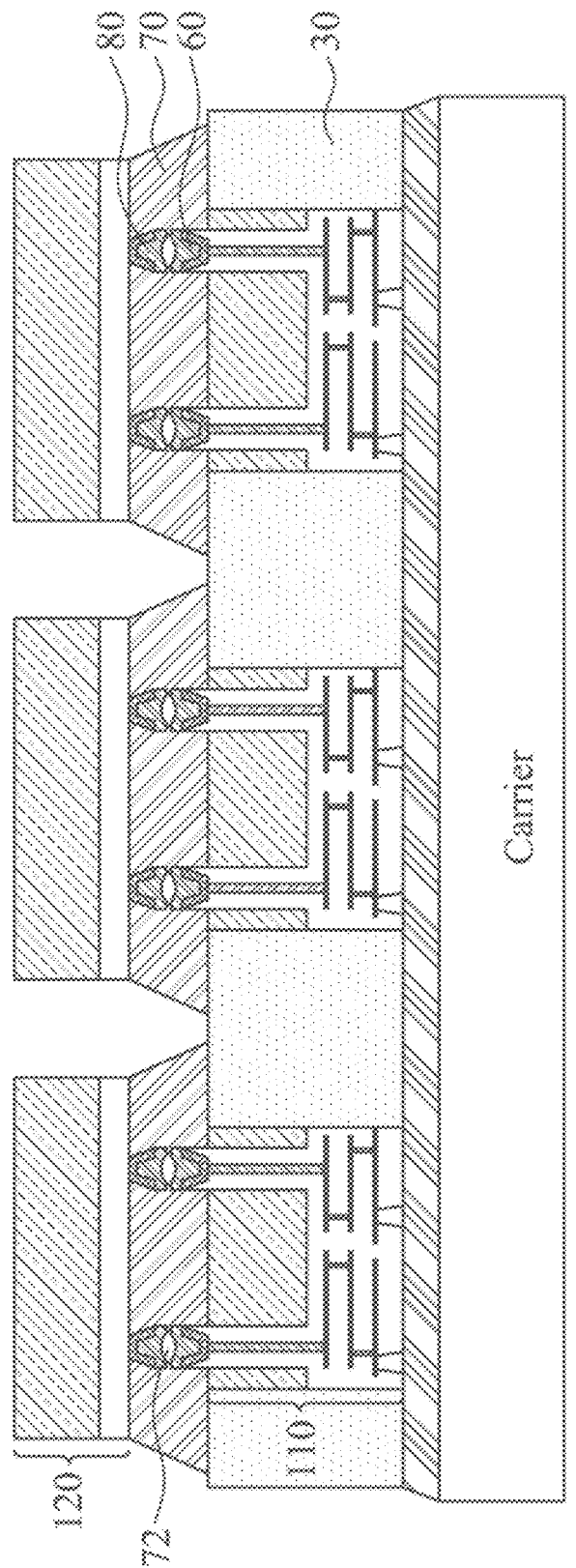

FIG. 2d illustrates chip joint and underfill injection steps. The second conductive elements 80 may be placed on the chips 120 before placing the chips 120 on the second chips 110. The chips 120 may be placed using any suitable method of placing the chips 120 on the second chips 110. The chips 120 may be aligned on the respective second chips 110 to allow coupling between the second conductive elements 80 and the conductive elements 60 (through the bumps 72). Thus, the chips 120 and the second chips 110 are coupled to each other without using an interposer (e.g., a wafer). The chips 120 may be larger than the second chips 110, resulting in an overhang structure when placed on the second chips 110. The underfill 70 may then be injected between each connected pair of chips 120 and second chips 110, which provides better support to the chips 120 overhang over the second chips 110.

Figure 2E:
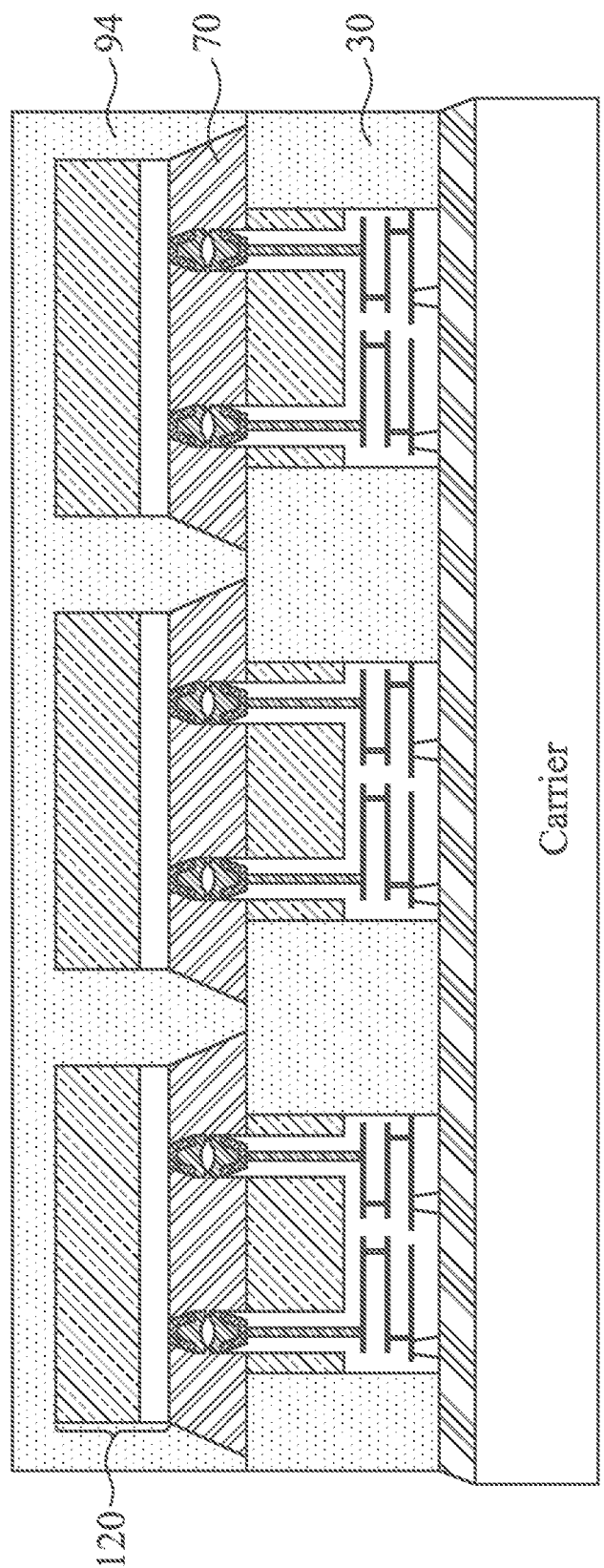

FIG. 2e illustrates a molding step, where the second molding compound 94 may be formed to encapsulate the chips 120 on the first molding compound 30. The second molding compound 94 may be a polymer, a molding underfill, the like, or a combination thereof. The second molding compound 94 may be formed by injecting the second molding compound 94 to envelope the chips 120 and the underfill 70 on the second chips 110 and the first molding compound 30.

Figure 2F:
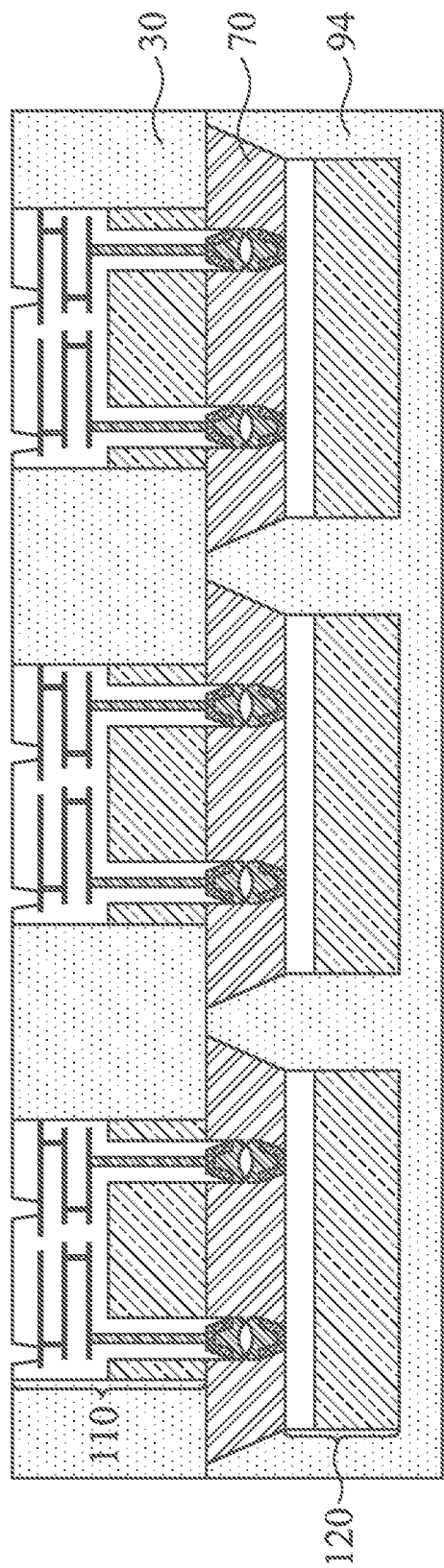

FIG. 2f illustrates a carrier de-bond step, where the carrier 50 and the adhesive layer 40 are removed. The carrier 50 may be removed by dissolving or etching the adhesive layer 40 that bonds the carrier 50 to the other components/layers. Further, the chip package may be flipped. The remaining bonded layers may comprise the second chips 110 (encapsulated in the first molding compound 30) on top of the underfill 70 and the chips 120 (encapsulated in the second molding compound 94).

Figure 2G:
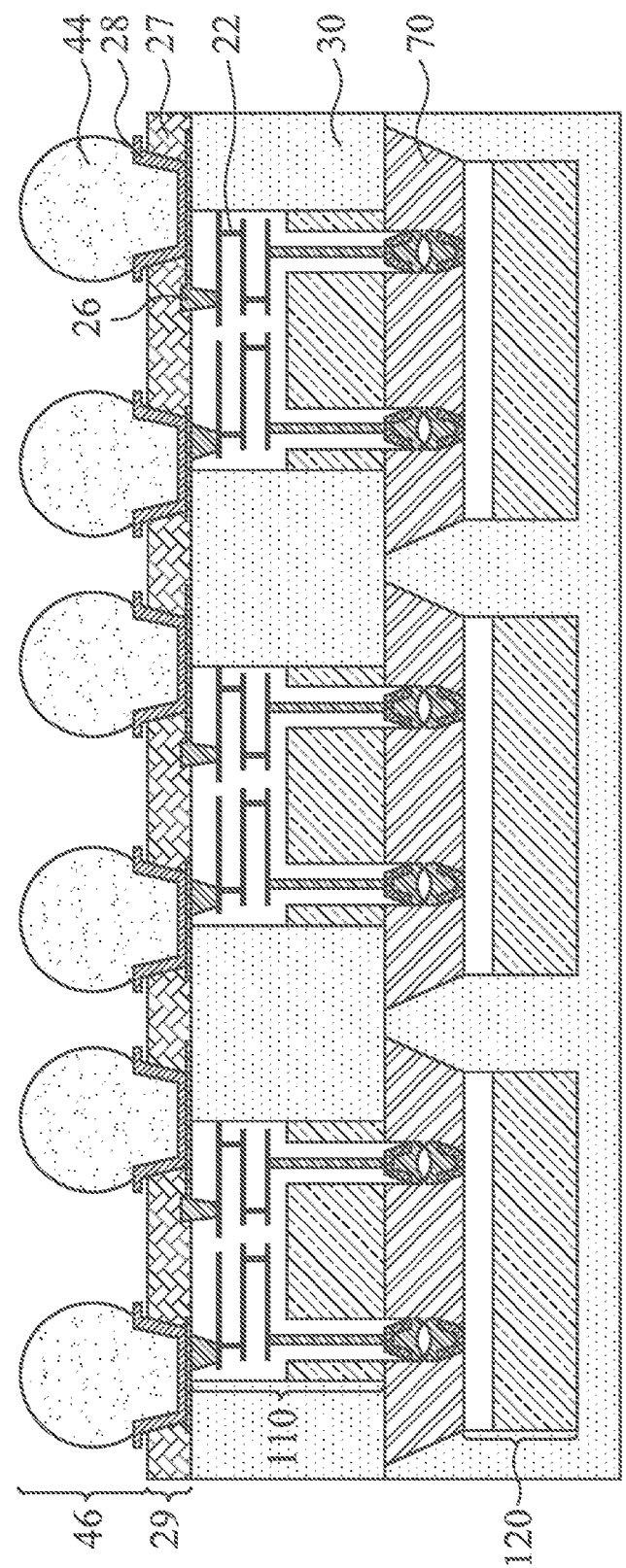

FIG. 2g illustrates fan-out RDL and BGA formation steps. The RDL 29 may be formed on top of the second chips 110 and the first molding compound 30. The conductive layer 26 of the RDL 29 may be formed (e.g., deposited) and patterned (e.g., using lithography processes or steps) to be in contact with the exposed through vias and pads 22. The polymer layer 27 of the RDL 29 may be formed to extend along exposed top surfaces of the first molding compound 30, the conductive layer 26, and the second chips 110. The BGA 46 may then be bonded to the RDL 29. The conductive structures 44 of the BGA 46 may be placed into contact with the conductive layer 26 of the RDL 29. In an embodiment, the BGA 46 may be coupled to the RDL 29 using a flip-chip bumping process. The conductive structures 44 of the BGA 46 may be coupled through UBM elements 28 that are formed on the conductive layer 26. The conductive structures 44 may be conductive spheres, C4 bumps, microbumps, or the like and may comprise a material such as tin, silver, lead-free tin, copper, the like, or a combination thereof.

In another embodiment, the BGA 46 may be coupled to RDL 29 by another chip bonding process that does not utilize UBM elements. The conductive layer 26 of the RDL 29 provides electrical coupling between the conductive structures 44 of the BGA 46, the through vias and pads 22 and the second through vias 12 of the second chips 110, the conductive elements 60 and the second conductive elements 80 embedded in the underfill 70, and the chips 120. This achieves a 3D fan-out structure for the chip package. In other embodiments, other interconnect structures or connectors may be coupled to the second chips 110 instead of the BGA, e.g., with or without the RDL 29, to achieve surface-mount packaging.

Figure 2H:
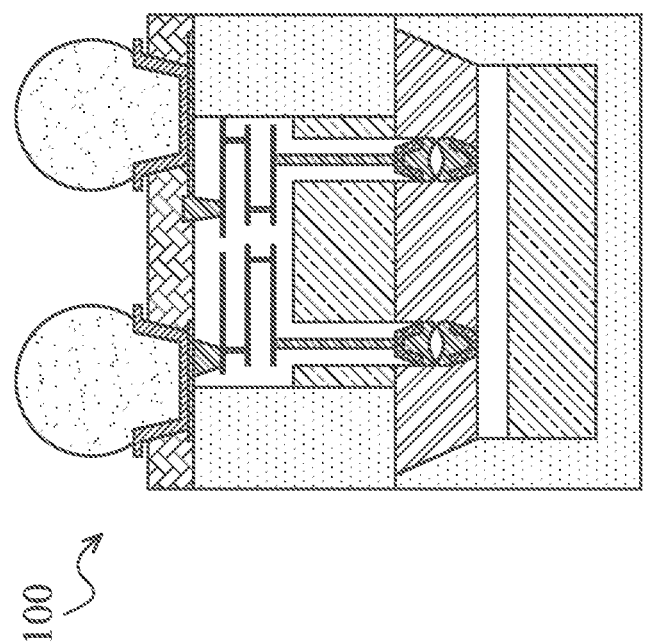

FIG. 2h illustrates dicing tape mount and die saw steps to obtain a plurality of similar chip/die packages, each corresponding to the chip package 100 of FIG. 1. The individual chip packages 100 may be obtained using a chip saw, patterned etch, laser, or the like step for separating the remaining bonded layers vertically along the lines between the adjacent chip/die packages. The resulting chip packages 100 may be separately sold, shipped, used, and/or integrated in devices or other packages.

As described above, the CoWoS like process flow in FIGS. 2a through 2h provides packaging without using a final substrate bonding step, as in a typical CoWoS process flow. This may simplify the manufacturing process and reduce cost. Further, the process flow provides efficient mechanical support to the resulting overhang structure (of FIGS. 2d and 2e) by encapsulating the second dies or chips 110 in the first molding compound 30 (in FIG. 2c), injecting the underfill 70 between the second chips 110 and the dies or chips 120 (in FIG. 2d), and encapsulating the chips 120 and the underfill 70 in the second molding compound 94 on the first molding compound 30 (in FIG. 2e). This may resolve overhang structure issues in fabrication, such as structure warping, and hence improve reliability and quality.

In accordance to an embodiment of the disclosure, a method of forming a chip package includes bonding a plurality of first dies on a carrier, encapsulating in a first molding compound the first dies on the carrier, coupling a plurality of second dies on the first dies using conductive elements, adding an underfill between the second dies and the first dies surrounding the conductive elements, and encapsulating in a second molding compound the second dies and the underfill.

In accordance to another embodiment of the disclosure, a chip package includes a first die, a molding compound encapsulating the first die, a second die coupled to the first die via conductive elements, an underfill between the first die and the second die encapsulating the conductive elements, a second molding compound encapsulating the second die and the underfill, a redistribution layer (RDL) coupled to one side of the first die opposite to the underfill, and a plurality of connectors providing a three-dimensional fan-out structure coupled to one side of the RDL opposite to the first die.

In accordance to another embodiment of the disclosure, a chip package includes a chip encapsulated in a molding compound and a larger chip coupled to the first chip via conductive elements, wherein the conductive elements are encapsulated in an underfill between the chip and the larger chip without an interposer and wherein the larger chip and the underfill are encapsulated in a second molding compound in contact with the molding compound.

In accordance to another embodiment of the disclosure, a method of forming a chip package comprising adding first conductive elements on a first die, adding second conductive elements on a second die larger than the first die, placing the second die on the first die to couple the second conductive elements to the first conductive elements without an interposer, and adding an underfill between the first die and the second die, wherein the underfill encapsulates the first conductive elements and the second conductive elements.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A chip package comprising:
   a first die comprising a semiconductor substrate;
   a second die;
   an underfill disposed between and in physical contact with the semiconductor substrate of the first die and the second die;
   one or more conductive elements encapsulated in the underfill and coupling the first die and the second die to each other; and
   one or more interconnection layers disposed at a side of the semiconductor substrate facing away from the underfill, the one or more interconnection layers electrically coupled to the one or more conductive elements encapsulated in the underfill by one or more through-vias extending through the semiconductor substrate.

2. The chip package of claim 1, further comprising:
a first molding compound encapsulating the first die; and
a second molding compound encapsulating the second die and the underfill, wherein peripheral regions of the first molding compound and the second molding compound physically contact each other.

3. The chip package of claim 1, wherein a width of the second die and a width of the underfill are greater than a width of the first die.

4. The chip package of claim 1, further comprising:
a redistribution layer (RDL) coupled to the first die, the RDL disposed at a side of the first die facing away from the underfill; and
an interconnect structure disposed at a side of the RDL facing away from the first die, the interconnect structure comprising a plurality of connectors for three-dimensional fan-out coupled to the RDL.

5. The chip package of claim 1, wherein the one or more conductive elements encapsulated in the underfill comprises an under-bump metallization element, a solder element, or combinations thereof.

6. The chip package of claim 1, wherein the first die and the second die comprise a plurality of layers of stacked chip logic.

7. The chip package of claim 1, wherein the first die is a system on chip (SoC) die.

8. A chip package comprising:
a first die;
a first molding compound encapsulating the first die;
a second die coupled to the first die via conductive elements;
an underfill between the first die and the second die encapsulating the conductive elements;
a second molding compound encapsulating the second die and the underfill on the first die;
a redistribution layer (RDL) on one side of the first die opposite to the underfill; and
a plurality of connectors providing a three-dimensional fan-out structure on one side of the RDL opposite to the first die.

9. The chip package of claim 8, wherein the second die over the first die forms an overhang structure, and wherein the first molding compound encapsulating the first die, the underfill between the first die and the second die, and the second molding compound encapsulating the second die provide mechanical support to the overhang structure.

10. The chip package of claim 8, wherein the second molding compound is in contact with the first molding compound.

11. The chip package of claim 8, wherein the first die is coupled to first conductive elements and the second die is coupled to second conductive elements, and wherein the first conductive elements are coupled to the second conductive elements inside the underfill.

12. The chip package of claim 11, wherein the connectors are coupled through the RDL to a combination of through vias and pads in the first die, and wherein the through vias and pads are coupled to the first conductive elements.

13. The chip package of claim 8, wherein the first die and the second die comprise a plurality of layers of stacked chip logic.

14. A chip package comprising:
a first chip encapsulated in a first molding compound; and
a second chip wider than the first chip and coupled to the first chip via conductive elements,
wherein the conductive elements are encapsulated in an underfill between the first chip and the second chip without an interposer;
wherein the second chip and the underfill are encapsulated in a second molding compound in contact with the first molding compound; and
wherein the second chip comprises:
one or more layers, and
a semiconductor substrate attached to the one or more layers.

15. The chip package of claim 14, wherein the first chip is a system on chip (SoC) die comprising:
stacked chip logic with through vias and pads across the stacked chips logic; and
a semiconductor substrate attached to the stacked chip logic and including second through vias coupled to the through vias and pads.

16. The chip package of claim 14, wherein the conductive elements encapsulated in the underfill comprise:
first conductive elements added to the first chip;
second conductive elements added to the second chip; and
joints that couple between the first conductive elements and the second conductive elements.

17. The chip package of claim 14, further comprising:
a redistribution layer (RDL) coupled to the first chip, wherein the first chip is positioned between the underfill and the RDL; and
an interconnect structure comprising a plurality of connectors for three-dimensional fan-out coupled to the RDL, wherein the RDL is positioned between the first chip and the interconnect structure.

18. The chip package of claim 17, wherein the RDL comprises a conductive layer coupled to the first chip and further a polymer layer coupled to the conductive layer and the interconnect structure, and wherein the interconnect structure is a ball grid array (BGA) comprising a plurality of conductive spheres coupled to the conductive layer.

19. The chip package of claim 1, wherein the first die is coupled to first conductive elements and the second die is coupled to second conductive elements, and wherein the first conductive elements are coupled to the second conductive elements inside the underfill.

20. The chip package of claim 14, wherein the first chip and the second chip comprise a plurality of layers of stacked chip logic.

* * * * *